(12) United States Patent
Marukame et al.

(10) Patent No.: US 9,054,739 B2
(45) Date of Patent: Jun. 9, 2015

(54) ERROR CORRECTION DEVICE, ERROR CORRECTION METHOD AND COMPUTER PROGRAM PRODUCT

(71) Applicant: KABUSHIKI KAISHA TOSHIBA, Minato-ku, Tokyo (JP)

(72) Inventors: Takao Marukame, Kanagawa (JP); Yoshifumi Nishi, Niigata (JP); Jiezhi Chen, Kanagawa (JP); Yusuke Higashi, Kanagawa (JP); Takahiro Kurita, Kanagawa (JP); Yuuichiro Mitani, Kanagawa (JP); Atsuhiro Kinoshita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 13/861,547

(22) Filed: Apr. 12, 2013

(65) Prior Publication Data

US 2013/0346825 A1    Dec. 26, 2013

(30) Foreign Application Priority Data

Jun. 22, 2012   (JP) ................................ 2012-140866

(51) Int. Cl.
*H03M 13/00*    (2006.01)
*H03M 13/11*    (2006.01)
(52) U.S. Cl.
CPC ...... *H03M 13/1102* (2013.01); *H03M 13/1108* (2013.01)

(58) Field of Classification Search
CPC ...................................................... H03M 13/09
USPC .................................. 714/758, 761, 785, 801
See application file for complete search history.

(56) References Cited

U.S. PATENT DOCUMENTS

| 8,386,894 B2 * | 2/2013 | Latremouille ................. 714/785 |
| 2004/0199860 A1 * | 10/2004 | Kim et al. ..................... 714/801 |

FOREIGN PATENT DOCUMENTS

JP    2011-197957    10/2011

* cited by examiner

*Primary Examiner* — Fritz Alphonse
(74) *Attorney, Agent, or Firm* — Finnegan, Henderson, Farabow, Garrett & Dunner, L.L.P.

(57) ABSTRACT

According to an embodiment, an error correction device includes first calculators, second calculators, estimators, and an inverter. Each first calculator calculates a first message representing a probability that 1-bit data that is input in a corresponding variable node is 1. Each second calculator calculates a second message representing a probability that a value of the data input to the variable node is 1 for each of two or more variable nodes connected to the check node by using the first messages of the variable nodes connected to the check node. Each estimator estimates a true value of the data input to the variable node to generate an estimated value by using the first and second messages. The inverter inverts the estimated value associated with at least one of the variable nodes with a probability higher than 0 and lower than 1.

20 Claims, 12 Drawing Sheets

TANNER GRAPH

OUTPUT POTENTIAL OF NODE ND2

CLOCK SIGNAL CLK

ERROR CORRECTION DEVICE, ERROR CORRECTION METHOD AND COMPUTER PROGRAM PRODUCT

CROSS-REFERENCE TO RELATED APPLICATIONS

This application is based upon and claims the benefit of priority from Japanese Patent Application No. 2012-140866, filed on Jun. 22, 2012; the entire contents of which are incorporated herein by reference.

FIELD

Embodiments described herein relate generally to an error correction device, an error correction method and a computer program product.

BACKGROUND

Low density parity check (LDPC) codes using low density parity check matrices in which the density of "1" is low are known. When error correction in a soft decision scheme is performed for decoding LDPC codes, high correction ability can be achieved but the processing time is increased. When error correction in a hard decision scheme is performed, on the other hand, the processing speed can be made higher but there is a problem that sufficient correction ability cannot be achieved.

Thus, in related art, a technique of combining the hard decision scheme and the soft decision scheme in such a manner that errors that cannot be corrected in the hard decision scheme are corrected in the soft decision scheme is known.

When the hard decision scheme and the soft decision scheme are combined, however, there is a problem that the configuration for packaging using semiconductor integrated circuits or the like becomes complicated.

DETAILED DESCRIPTION

Figure 1:
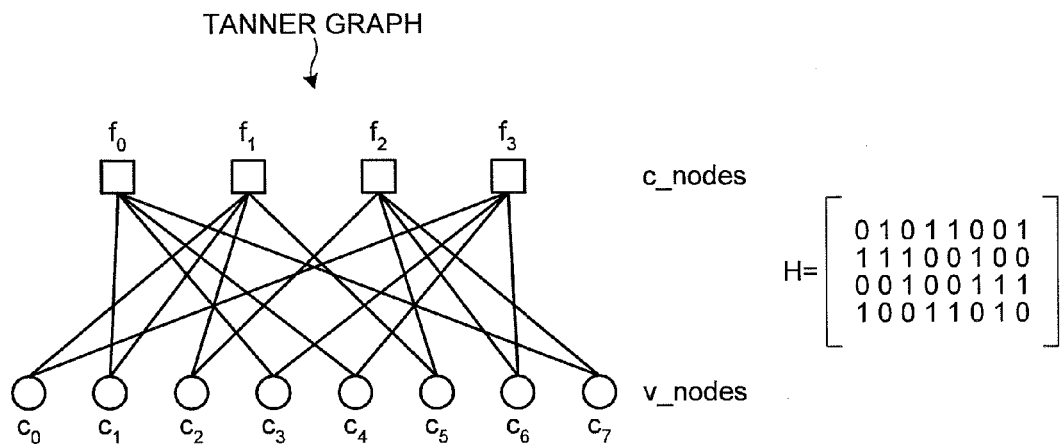
FIG. 1 is a diagram illustrating an example of a Tanner graph representing a check matrix according to an embodiment.

According to an embodiment, an error correction device includes first calculators, second calculators, estimators, and an inverter. Each of the first calculator is provided for is provided for each of variable nodes to which pieces of 1-bit data coded on the basis of a low density parity check matrix and calculates a first message representing a probability that a value of the data input to the variable node is 1. Each of the second calculators is provided for each of check nodes connected to the variable nodes in connecting states according to the low density parity check matrix and calculates a second message representing a probability that a value of the data input to the variable node is 1 for each of two or more variable nodes connected to the check node by using the first messages of the variable nodes connected to the check node. Each of the estimators is provided for each of the variable nodes and estimates a true value of the data input to the variable node to generate an estimated value by using the first and second messages. The inverter inverts the estimated value associated with at least one of the variable nodes with a probability higher than 0 and lower than 1.

An embodiment will be described in detail below with reference to the accompanying drawings.

First, description on LDPC will be made before description on the error correction device according to the embodiment. An LDPC code is a code characterized by a low density parity check matrix H (which is also simply referred to as a "check matrix H" in the following description) in which the density of "1" is low (i.e., most elements of the matrix are "0" and only a few elements are "1"). The size of the check matrix H increases with the code length, but it is assumed here that the check matrix H is a matrix of 8 rows and 4 columns for convenience of explanation.

The number of "1"s contained in each row and each column of the check matrix H is referred to as a weight, and it is assumed here that the weights of the respective rows and the respective columns of the check matrix H are larger than 0. A case in which the weights of the respective rows are uniform (constant values) and the weights of the respective columns are uniform (constant values) is referred to as regular. Herein, the check matrix H is a regular matrix in which the weights of the respective rows are all 4 and the weights of the respective columns are all 2.

In an LDPC code, a data string x to be transmitted to a channel or stored in a memory and processed is converted to a data string c where $Hc^T=0$. This c is referred to as a code. That is, data used for information processing are not the original signal x itself but the code c. In general, the code c is a data string longer than the data string x and contains information necessary for error correction in addition to information contained in the data string x, but the coding itself is mapping in which the data string x corresponds one-to-one to the code c. In other words, when a data string x is given, a code c is uniquely determined, while conversely, when a code c is given, the original data string x thereof is uniquely determined. (Length of data string x)/(length of code c) is referred to as a coded rate. An error correction method can be deemed to be more efficient as the coded rate is higher.

The check matrix H can be expressed by a Tanner graph representing connecting states between a plurality of check nodes associated one-to-one with a plurality of rows and a plurality of variable nodes associated one-to-one with a plurality of columns. While an example of 8-bit data string will be described for simplicity of explanation, longer data strings such as a 1000-bit data string as will be described later are used in practical examples. FIG. 1 is a diagram illustrating an example of the Tanner graph representing the check matrix H. The Tanner graph includes a plurality of check nodes f0 to f3 associated one-to-one with a plurality of (four in the example of FIG. 1) rows of the check matrix H and arranged at an upper part thereof, and a plurality of variable nodes c0 to c7 associated one-to-one with a plurality of (eight in the example of FIG. 1) columns of the check matrix H and arranged at a lower part thereof, in which a check node fj and a variable node ci corresponding to a combination of a row and a column where the element of the check matrix H is "1" are connected. For example, in the example of FIG. 1, a check node f0 corresponding to the zeroth row and a variable node c1 corresponding to the first column are connected, which means that the element on the zeroth row and the first column is "1". In this manner, the check matrix H can be expressed by a Tanner graph representing connecting states between check nodes fj and variable nodes ci.

Next, a basic error correction method for LDPC codes will be described. Herein, a case of belief propagation (BP) will be described. Specifically, an error correction method in a soft decision scheme will be described. Soft decision is the antonym of hard decision for digitally making determination as "0" or "1" by using one threshold, and is for determining a probability of being 0 (likelihood of being "0") or a probability of being 1 (likelihood of being "1") in an analog manner instead of making complete determination of 0 or 1.

Herein, a set of data (digital data) resulting from coding using the check matrix H is stored in a memory (such as a DRAM, an MRAM, an NAND flash memory or an ReRAM) or a channel that is not illustrated, and a string {yi} that is a physical quantity (a value of reading voltage, for example) for reading a coded data string from the memory is input to each variable node {ci, ck, . . . }. The variable node ci calculates a probability Pi that the value of digital data stored in the memory is 1 (from a different perspective, a probability that the value of digital data associated with the variable node ci is 1) from the received physical quantity yi. The variable node ci transmits the calculated probability Pi as a first message {qij, qkj, . . . } to each of the check nodes {fj, fk, . . . } connected thereto.

Figure 2:
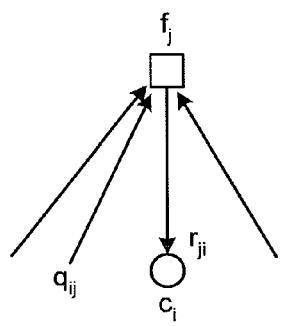
FIG. 2 is a diagram for explaining an example of a method for calculating a second message according to the embodiment.

The check node fj calculates a second message {rij, rkj, . . . } representing a probability that the value of digital data associated with a variable node is 1 for each of the variable nodes {ci, ck, . . . } connected thereto, and returns the second message to the corresponding variable node (see FIG. 2). Note that the check node fj does not take the first message qij transmitted from the variable node ci into account in calculation of the second message rij to be returned to the variable node ci, for example. In other words, the variable node ci will receive a second message rij that is calculated on the basis of the first messages {qkj, clj, . . . } from the variable nodes {ck, cl, . . . } connected to the check node fj other than the variable node ci.

The variable node ci calculates a probability Qi that the value of digital data associated with the received physical quantity yi is 1 by using the second messages {rji, rki, . . . } received from the respective check nodes {fj, fk, . . . } connected thereto and the probability Pi (the first message qij) thereof. In this example, it is assumed that the value of the digital data associated with the received physical quantity yi is 1 when Qi is ½ or higher, while it is assumed that the value of the digital data associated with the received physical quantity yi is 0 when Qi is lower than ½.

Figure 3:
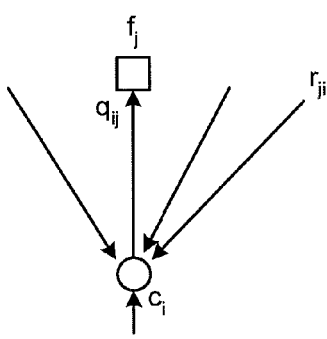
FIG. 3 is a diagram for explaining an example of a method for recalculating a first message according to the embodiment.

Then, parity check is performed by using the assumed values. More specifically, it is determined whether $H_{ctemp}^T=0$ is satisfied for a string $c_{temp}=\{c_{0temp}, C_{1temp}, \ldots\}$ of assumed values. If $H_{ctemp}^T=0$ is satisfied, it is concluded that the string $c_{temp}$ of assumed values is the digital data string stored in the memory and the calculation is terminated. Since, however, this conclusion is an estimation result, there is possibility that the conversion has resulted in erroneous data. This is why the LDPC is classified as "estimation-based". If $H_{ctemp}^T=0$ is not satisfied, on the other hand, the variable node ci recalculates the first message and transmits the first message to the check nodes {fj, fk, . . . } connected thereto. In this case, the first message qij to be transmitted from the variable node ci to the check node fj, for example, is calculated from the probability Pi and the second messages {rki, rli, . . . } received from the check nodes {fk, fl, . . . } connected to the variable node ci other than the check node fj. Thus, the second message rji received from the check node fj is not taken into account in the calculation of the first message qij. In other words, the check node fj will receive the first message qij calculated on the basis of the second messages {rki, rli, . . . } from the check nodes {fk, fl, . . . } connected to the variable node ci other than the check node fj (see FIG. 3). The check node fj calculates a second message {rij, rkj, . . . } representing a probability that the data associated with a variable node is 1 for each of the variable nodes {ci, ck, . . . } connected thereto so that a parity condition is satisfied on the basis of the first messages {qij, qkj, . . . } received from the respective variable nodes {ci, ck, . . . } connected thereto, and returns the second message to the corresponding variable node. The above-described algorithm is repeated until the parity condition is satisfied. The error correction in the LDPC is performed by repeating the calculations.

Next, an error correction method in a hard decision scheme will be described. Here, reading of a coded data string from the memory (such as a DRAM, an MRAM, an NAND flash memory or an ReRAM) or the channel is terminated, and a string $c^0=\{c_i^0, c_k^0, \ldots\}$ digital data determined to be "0" or "1" according to whether or not the value of reading voltage is a predetermined threshold or higher, for example, is input to each variable node $\{ci, cj, \ldots\}$. From a different perspective, it can also be deemed that each bit of one-bit data string that may contain error and that is obtained by coding using the check matrix H is input a variable bit corresponding one-to-one thereto. The variable node ci calculates the probability Pi that the value of digital data associated with the variable node ci is 1 on the basis of the value of the received digital data $c_i^0$. Here, the variable node ci calculates the value of the received digital data $c_i^0$ as the probability Pi without any change. For example, the probability Pi is "1" if the value of the digital data $c_i^0$ received by the variable node ci is "1", while the probability Pi is "0" if the received digital data $c_i^0$ is "0". The variable node ci then transmits the calculated Pi as the first message $\{qij, qkj, \ldots\}$ to each of the check nodes $\{fj, fk, \ldots\}$ connected thereto.

The check node fj calculates the second message $\{rij, rkj, \ldots\}$ representing the probability that the data associated with a variable node is 1 for each of the variable nodes $\{ci, ck, \ldots\}$ connected thereto so that the parity condition is satisfied, and returns the second message to the corresponding variable node. Herein, the first message transmitted from each variable node represents the value itself of digital data received by the variable node, and the parity condition of the check matrix H illustrated in FIG. 1 is that the number of 0s (Lows) is an even number. Accordingly, if the sum of the values of the first messages $\{qij, qkj, \ldots\}$ other than qij received by the check node fj is "0", for example, the value of digital data to be received by the variable node ci has to be "0" so as to satisfy the parity condition. Since the check node fj calculates the value ("0" or "1") of digital data to be received by the variable node ci as the second message rij representing the probability that the value of digital data associated with the variable node ci is 1, the second message rij calculated by the check node fj in this case is "0" and the second message rij is returned to the variable node ci. If, on the other hand, the sum of the values of the first messages $\{qij, qkj, \ldots\}$ other than qij received by the check node fj is "1", for example, the value of digital data to be received by the variable node ci has to be "1" so as to satisfy the parity condition. In this case, the second message rij calculated by the check node fj is "1", and the second message rij is returned to the variable node ci.

The variable node ci estimates a true value $c_i^1$ of the digital data associated with the variable node ci (the value of digital data to be received by the variable node ci) by using the second messages $\{rji, rki, \ldots\}$ received from the respective check nodes $\{fj, fk, \ldots\}$ connected thereto and the probability Pi (first message qij) thereof. More specifically, the variable node ci estimates the true value $c_i^1$ of the digital data associated with the variable node ci by majority decision of values of digital data represented by the second messages $\{rji, rki, \ldots\}$ received from the respective check nodes $\{fj, fk, \ldots\}$ connected thereto and the probability Pi (first message) thereof. For example, $c_i^1$ is estimated to be "0" if the number of "0"s is larger, while $c_i^1$ is estimated to be "1" if the number of "1"s is larger.

The parity check is performed by using a string $c^1 = \{c_i^1, c_k^1, \ldots\}$ of estimated values obtained for each variable node $\{ci, cj, \ldots\}$ as described above (Herein, the parity check is likelihood calculation in the sense of checking provable values. Since the likelihood is expressed by parity in hard decision, these are substantially synonymous. This parity check will, however, hereinafter be referred to as likelihood calculation so as to be distinguished from parity check for checking using a check matrix on all data.). More specifically, it is determined whether or not the string $c^1$ of estimated values satisfy $Hc^{1T} = 0$. If $Hc^{1T} = 0$ is satisfied, it is determined that the data string read out from the memory (the string of coded data) is the string $c^1$ of estimated value and the calculation is terminated. If $Hc^{1T} = 0$ is not satisfied, on the other hand, the variable node ci transmits $c_i^1$ representing the estimation result described above as the first message to each of the check nodes $\{fj, fk, \ldots\}$ connected thereto. The check node fj calculates the second message $\{rij, rkj, \ldots\}$ for each of the variable nodes $\{ci, ck, \ldots\}$ connected thereto so that the parity condition is satisfied on the basis of the first messages $\{qij, qkj, \ldots\}$ received from the respective variable nodes $\{ci, ck, \ldots\}$ connected thereto, and returns the second message to the corresponding variable node. The above-described algorithm is repeated until the parity condition is satisfied. Details of the basic error correction method for LDPC codes are as described above.

Figure 4:
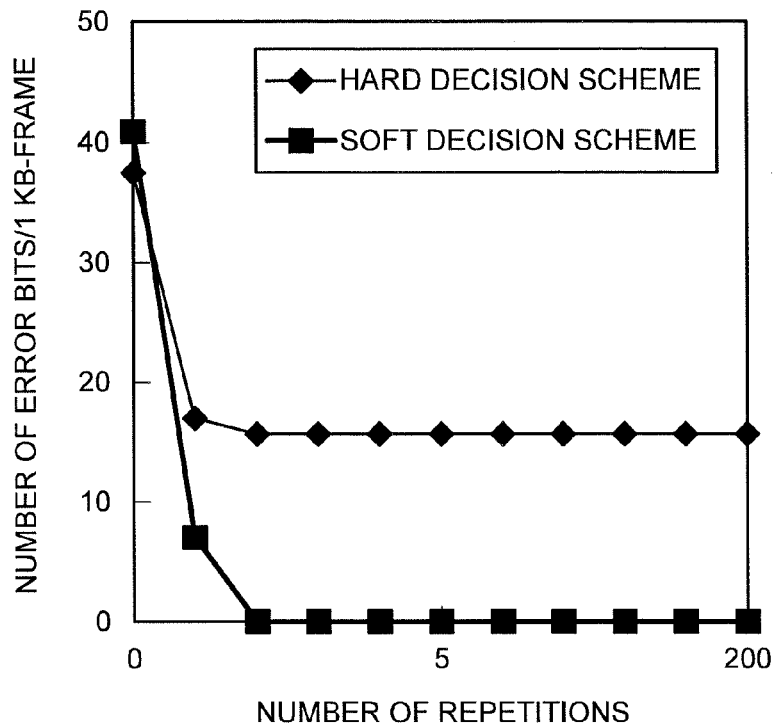
FIG. 4 is a graph of verification results in a soft decision scheme and a hard decision scheme according to the embodiment.

Note that there is a problem that sufficient correction ability cannot be achieved if error correction in the hard decision scheme is performed while high correction ability can be achieved if error correction in the soft decision scheme is performed. In order to verify the problem, simulation of error correction on an LDPC code using a check matrix including about 1,000 columns was performed in each of the hard decision scheme and the soft decision scheme. The condition of the simulation was that an AWGN channel was assumed, errors were generated using an S/N ratio as a parameter, and error correction in each of the soft decision scheme and the hard decision scheme was performed. The median values of the number of remaining errors (number of error bits) were verified with respect to the number of iterations of the algorithm described above by using ten types of input signals for each scheme. As a result of this verification, the number of error bits reached 0 with the number of iterations being two in the case of the soft decision scheme while the number of error bits was saturated at about a half thereof in the case of the hard decision scheme as illustrated in FIG. 4.

In the hard decision scheme, if an estimation result (an estimation result obtained by majority decision) of one bit is inverted when errors are corrected to some extent, the other bit will not satisfy the parity condition under the influence of the inversion, while if an estimation result of the other bit is inverted, the one bit will not satisfy the parity condition under the influence of the inversion. It can be considered that such a closed loop of calculation for correction produced by the result of likelihood calculation may be entered in a state in which errors are not corrected any more. This is similar to stop of calculation at local minimum of energy in physical simulations.

Figure 5:
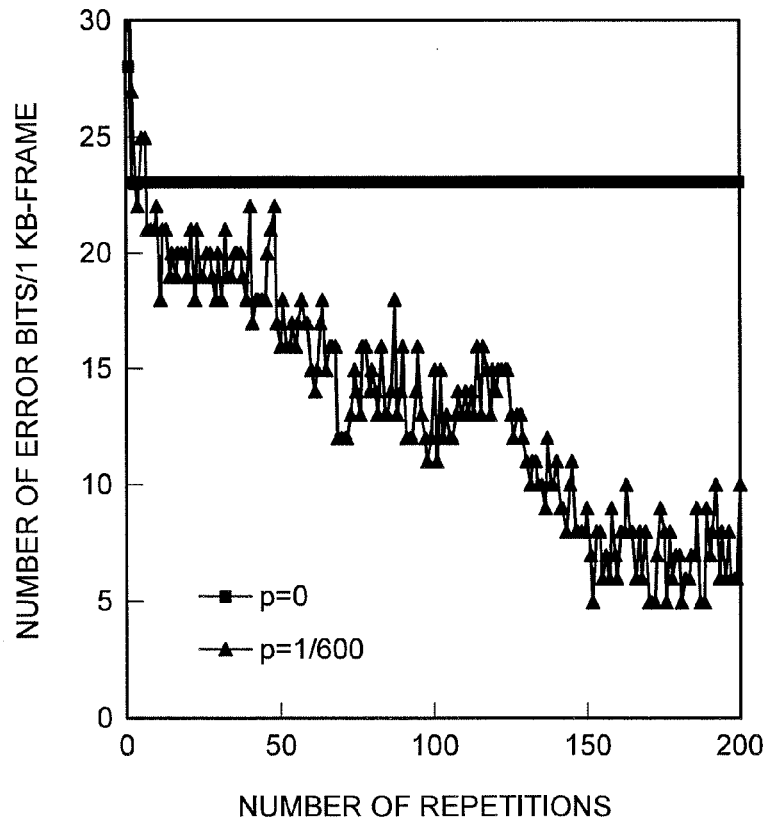
FIG. 5 is a graph illustrating the relation between the number of iterations of an algorithm and the number of remaining errors.

In the embodiment, it is therefore found that, in order to avoid the closed loop of the calculation for correction produced by the result of likelihood calculation and the state in which errors are not corrected any more in error correction in the hard decision scheme, it is necessary to disturb the closed loop of the calculation for correction. In addition, in the embodiment, calculation of random bit inversion is performed with a low probability is performed while performing error correction so as to be less likely to be trapped at local minimum. More specifically, after bit estimation by majority decision described above, the bit is inverted with a probability p ($0 < p < 1$). As illustrated in FIG. 5, for example, it is found that when the value of the estimated bit is inverted with a probability of $p = 1/600$, the number of remaining errors decreases with the increasing number of iterations and finally reaches about $1/3$ of a case in which the value of the estimated bit is not inverted (a case of $p = 0$). As described above, it is found that it is preferable to invert the estimated bit with a probability higher than 0 and lower than 1 in order to break the loop of parity check calculation.

Figure 6:
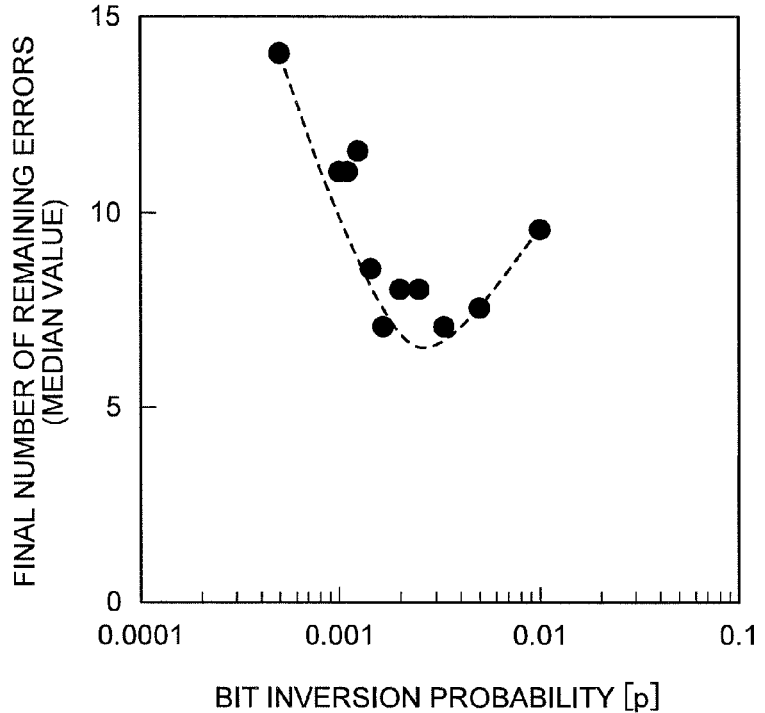
FIG. 6 is a graph illustrating the relation between bit inversion probability and the number of remaining errors.

FIG. 6 is a graph illustrating the relation between the probability p and a median value of the final number of remaining errors. In the case in which the estimated bit is inverted with a probability of p=1/6000 to 1/100, the final number of remaining errors is smaller than "15" while the median value of the final number of remaining errors is "15" in the case in which the estimated bit is not inverted, and it is therefore found that the error correction ability can be improved. Furthermore, in the case in which the estimated bit is inverted with a probability of p=1/1000 to 1/100, the final number of remaining errors can be "10" or smaller, and it is therefore found that the error correction ability can be further improved.

Figure 7:
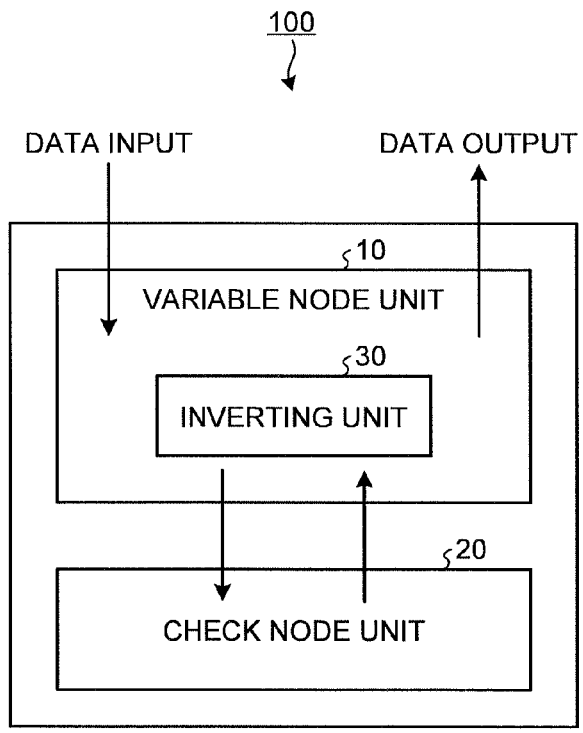
FIG. 7 is a diagram illustrating an exemplary configuration of an error correction device according to the embodiment.

The principles of the present invention have been described above. In the following, details of an error correction device 100 according to the embodiment will be described. FIG. 7 is a block diagram illustrating an exemplary configuration of the error correction device 100. The error correction device 100 performs error correction in the hard decision scheme, and receives as input a one-bit data string obtained by coding using a low density parity check matrix (which can also be regarded as a digital data string in which determination as "0" or "1" is made by hard decision, that is, a data string that may contain errors). As illustrated in FIG. 7, the error correction device 100 includes a variable node unit 10, a check node unit 20 and an inverting unit 30. Although the inverting unit 30 is included in the variable node unit 10 in this example, the configuration is not limited thereto.

Figure 8:
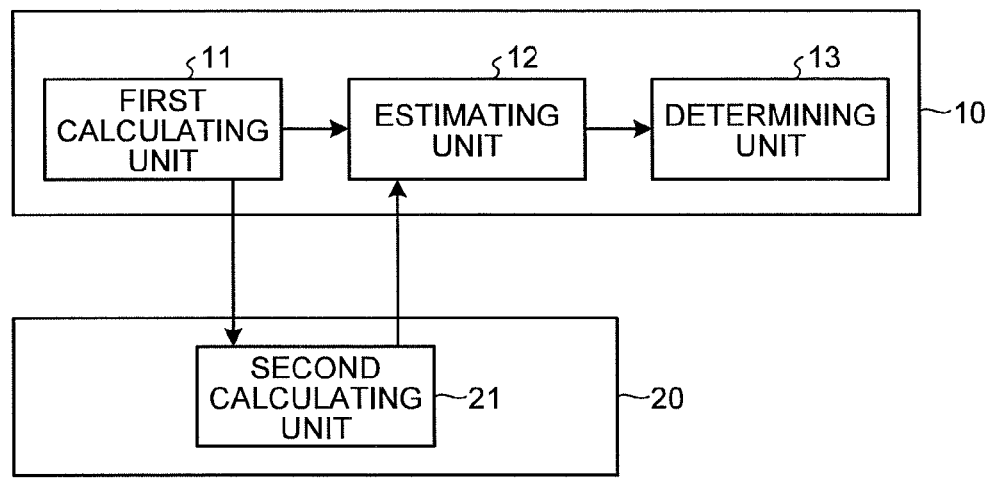
FIG. 8 is a diagram illustrating exemplary configurations of a variable node unit and a check node unit according to the embodiment.

FIG. 8 is a block diagram illustrating an exemplary functional configuration of the variable node unit 10 and the check node unit 20. In FIG. 8, the inverting unit 30 is not illustrated. As illustrated in FIG. 8, the variable node unit 10 includes a first calculating unit 11, an estimating unit 12 and a determining unit 13. Meanwhile, the check node unit 20 includes a second calculating unit 21. Functions of each of the first calculating unit 11, the second calculating unit 21, the estimating unit 12 and the determining unit 13 will be described below.

The first calculating unit 11 is provided for each of a plurality of variable nodes to which a plurality of pieces of one-bit data obtained by coding using a low density parity check matrix. For convenience of explanation, only one first calculating unit 11 is illustrated in the example of FIG. 8. Each first calculating unit 11 calculates a first message representing a probability that the value of the one-bit data input to a variable node associated therewith is 1, and transmits the first message to each of two or more check nodes to which the variable node associated therewith is connected. Since the error correction device 100 in the embodiment performs error correction in the hard decision scheme, each first calculating unit 11 calculates a value of digital data to be input to the variable node associated therewith as the first message of the variable node, and transmits the first message to each of a plurality of check nodes connected to the variable node.

The second calculating unit 21 is provided for each of a plurality of check nodes connected to a plurality of variable nodes in the connecting states according to the low density parity check matrix. For convenience of explanation, only one second calculating unit 21 is illustrated in the example of FIG. 8. Each second calculating unit 21 calculates a second message (referred to as a likelihood in the sense of a probable value) representing a probability that the value of data to be input to each of two or more variable nodes connected to the check node associated therewith by using the first messages transmitted from the respective ones of two or more variable nodes connected to the check node associated therewith, and returns the second message to the variable node. In this case, each second calculating unit 21 calculates the value ("0" or "1") of digital data determined to be input to each of the two or more variable nodes connected to the check node associated therewith as the second message (likelihood) of the variable node on the basis of the first messages of the variable nodes other than the corresponding variable node connected to the check node associated therewith and the parity condition, and transmits the calculated second message to the corresponding variable node. In the hard decision scheme, the likelihood can be expressed in such a simple manner that the likelihood of being "1" is expressed by 1 and the likelihood of being "0" is expressed by "0".

The estimating unit 12 is provided for each of a plurality of variable nodes. For convenience of explanation, only one estimating unit 12 is illustrated in the example of FIG. 8. Each estimating unit 12 estimates a true value of data to be input (the value of data to be input) to the variable node associated therewith by majority decision of the first message and the second message of the variable node associated therewith to generate an estimated value. For example, if the number of "0"s is larger, each estimating unit 12 estimates that the true value of data to be input to the variable node associated therewith is "0" and generates an estimated value "0". If the number of "1"s is larger, on the other hand, each estimating unit 12 estimates that the true value of data to be input to the variable node associated therewith is "1" and generates an estimated value "1". Note that the method for estimating a true value of data to be input to a variable node by using the first message and the second message is not limited to majority decision but various known techniques can be used. Thus, each estimating unit 12 may be in any form that estimates a true value of data to be input to the variable node associated therewith by using the first message and the second message associated therewith to generate an estimated value.

The determining unit 13 determines whether or not an estimated value output from the inverting unit 30, which will be described later, satisfies the parity condition. In the embodiment, as will be described later, estimated values for all the variable nodes are subjects of inversion by the inverting unit 30, and the determining unit 13 performs parity check by using a bit string $c^1$ (which may contain an estimated value that is not inverted) output from the inverting unit 30. More specifically, the determining unit 13 determines whether or not the bit string $c^1$ satisfies $Hc^{1T}=0$. If $Hc^{1T}=0$ is satisfied, it is determined that the string of coded data is the bit string $c^1$ output from the inverting unit 30 and the calculation is terminated. If $Hc^{1T}=0$ is not satisfied, on the other hand, each first calculating unit 11 calculates the estimated value of the variable node associated therewith output from the inverting unit 30 as the first message of the variable node associated therewith. The above-described algorithm is then repeated.

In the embodiment, the functions of each of the first calculating unit 11, the second calculating unit 21, the estimating unit 12 and the determining unit 13 described above are implemented by a dedicated hardware circuit (a semiconductor integrated circuit, for example). Alternatively, a computer including a CPU, a ROM, a RAM and the like may be provided in the error correction device 100 and at least part of the functions of each of the first calculating unit 11, the second calculating unit 21, the estimating unit 12 and the determining unit 13 described above may be implemented by executing programs stored in the ROM or the like by the CPU.

Figure 9:
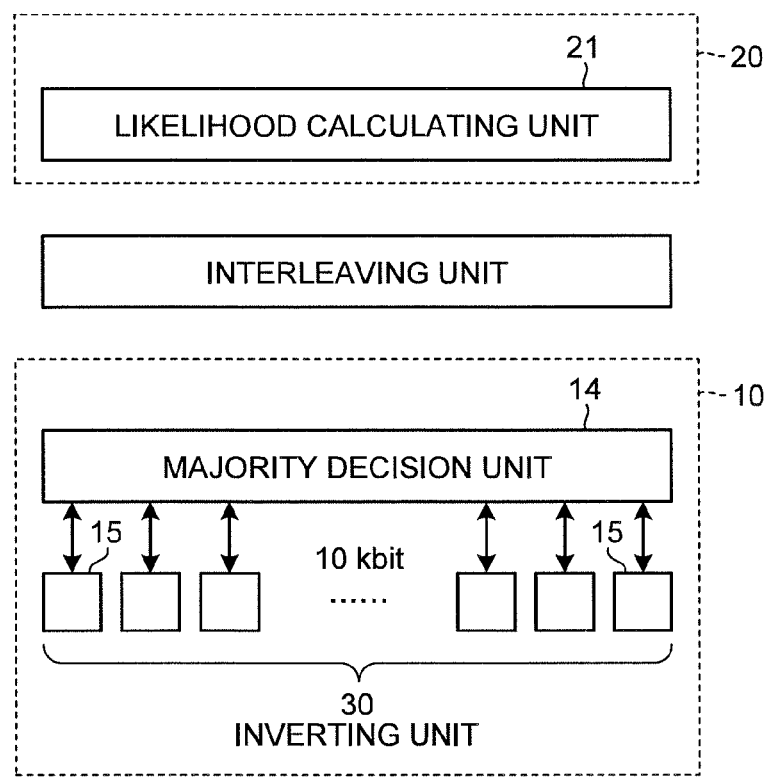
FIG. 9 is a diagram illustrating an exemplary configuration of the error correction device according to the embodiment.

FIG. 9 is a diagram illustrating a detailed exemplary configuration of the error correction device 100. As illustrated in FIG. 9, the check node unit 20 includes a likelihood calculating unit 21. The likelihood calculating unit 21 includes a plurality of likelihood calculating circuits associated one-to-one with a plurality of check nodes. The detailed configuration of the likelihood calculating circuits will be described later. The variable node unit 10 includes a majority decision unit 14 connected to the variable nodes. The majority decision unit 14 includes a plurality of majority decision circuits associated one-to-one with a plurality of variable nodes. The detailed configuration of the majority decision circuits will be described later. The majority decision circuits correspond to the estimating unit 12 described above. As illustrated in FIG. 9, the variable node unit 10 includes a plurality of storage cells 15 associated one-to-one with a plurality of variable nodes. Each storage cell 15 has stored therein an estimated value of the variable node associated with the storage cell 15. The estimated value stored in each storage cell 15 is inverted by the inverting unit 30. Details thereof will be described later.

In the example of FIG. 9, the likelihood calculating unit 21 and the majority decision unit 14 are connected by connections corresponding to the check matrix. The connections may be referred to as an interleaving unit. The interleaving unit may be in a form made up by physical wiring or may be in a form connected via a bus line through which necessary information is mutually transmitted in a time division manner.

Figure 10:
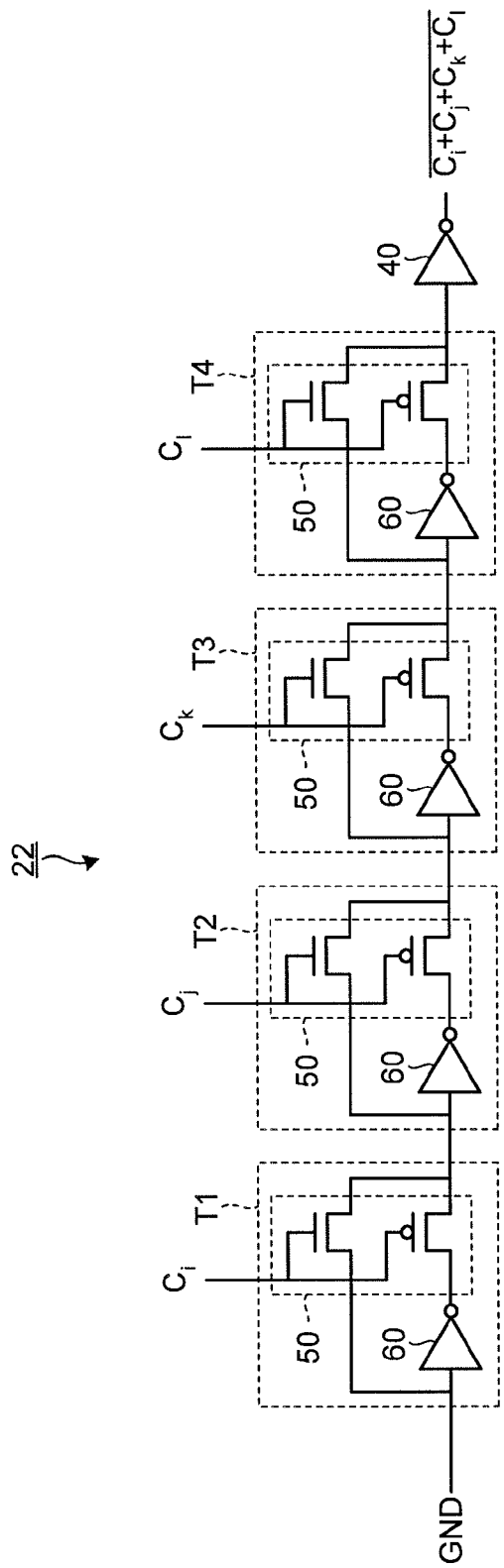
FIG. 10 is a diagram illustrating an exemplary configuration of a likelihood calculating circuit according to the embodiment.

FIG. 10 is a diagram illustrating an exemplary configuration of the likelihood calculating circuits. FIG. 10 illustrates a likelihood calculating circuit 22 associated with a check node fj connected to variable nodes ci, cj, ck and cl. As illustrated in FIG. 10, the likelihood calculating circuit 22 includes four unit circuits (T1 to t4) connected in series and a final stage inverter 40. Each of the four unit circuits (T1 to T4) includes a CMOS 50 and an inverter 60. The first stage unit circuit T1 is associated with the variable node ci, a first message ("0" or "1") from the variable node ci is input to a gate of the CMOS 50 thereof (the first message input to the gate is represented by ci herein), and an output signal from the CMOS 50 is input to the second stage unit circuit T2. In addition, an output of the inverter 60 of the first stage unit circuit T1 is connected to an electrode at an input of a PMOS while an input of the inverter 60 is connected to an electrode at an input of an NMOS. Furthermore, a GND-level (low-level) input signal is supplied to the input of the inverter 60.

The second stage unit circuit T2 is associated with the variable node cj, a first message from the variable node cj is input to a gate of the CMOS 50 thereof (the first message input to the gate is represented by cj herein), and a signal output from the CMOS 50 is input to the third stage unit circuit T3. In addition, an output of the inverter 60 of the second stage unit circuit T2 is connected to an electrode at an input of a PMOS while an input of the inverter 60 is connected to an electrode at an input of an NMOS. Furthermore, a signal output from the first unit circuit T1 is input to the inverter 60 of the second stage unit circuit T2.

The third stage unit circuit T3 is associated with the variable node ck, a first message from the variable node ck is input to a gate of the CMOS 50 thereof (the first message input to the gate is represented by ck herein), and a signal output from the CMOS 50 is input to the fourth stage unit circuit T4. In addition, an output of the inverter 60 of the third stage unit circuit T3 is connected to an electrode at an input of a PMOS while an input of the inverter 60 is connected to an electrode at an input of an NMOS. Furthermore, a signal output from the second unit circuit T2 is input to the inverter 60 of the third stage unit circuit T3.

The fourth stage unit circuit T4 is associated with the variable node cl, a first message from the variable node cl is input to a gate of the CMOS 50 thereof (the first message input to the gate is represented by cl herein), and a signal output from the CMOS 50 is input to the final stage inverter 40. The signal obtained by inversion at the final stage inverter 40 is a final output signal. In addition, an output of the inverter 60 of the fourth stage unit circuit T4 is connected to an electrode at an input of a PMOS while an input of the inverter 60 is connected to an electrode at an input of an NMOS. Furthermore, a signal output from the third unit circuit T3 is input to the inverter 60 of the fourth stage unit circuit T4.

In the likelihood calculating circuit 22 of FIG. 10, when the input ci is low level (when the input ci is "0"), the NMOS of the first stage unit circuit T1 is turned off and the PMOS thereof is turned on, and the GND level input signal therefore passes through the PMOS after being inverted by the inverter 60 and is then input to the second stage unit circuit T2. When the input ci is high level (when the input ci is "1"), the NMOS of the first stage unit circuit T1 is turned on and the PMOS thereof is turned off, and the GND level input signal therefore passes through the NMOS without passing through the inverter 60 and is then input to the second stage unit circuit T2. In the likelihood calculating circuit 22 of FIG. 10, when the number of low level signals among ci, cj, ck and cl is an even number, the GND-level input signal will be inverted an even number of times and then inverted by the final stage inverter 40, and the final output signal will therefore be high level. When the number of low level signals among ci, cj, ck and cl is an odd number, on the other hand, the GND-level input signal will be inverted an odd number of times and then inverted by the final stage inverter 40, and the final output signal will therefore be low level. Accordingly, when the parity condition is that the number of "0s (low levels)" is an even number, the parity condition will be satisfied (parity is correct) if the signal output from the likelihood calculating circuit 22 is high level. If, on the other hand, the signal output from the likelihood calculating circuit 22, the parity condition will not be satisfied (parity is violated). In this manner, it is possible to check the parity condition by likelihood calculation.

Figure 11:
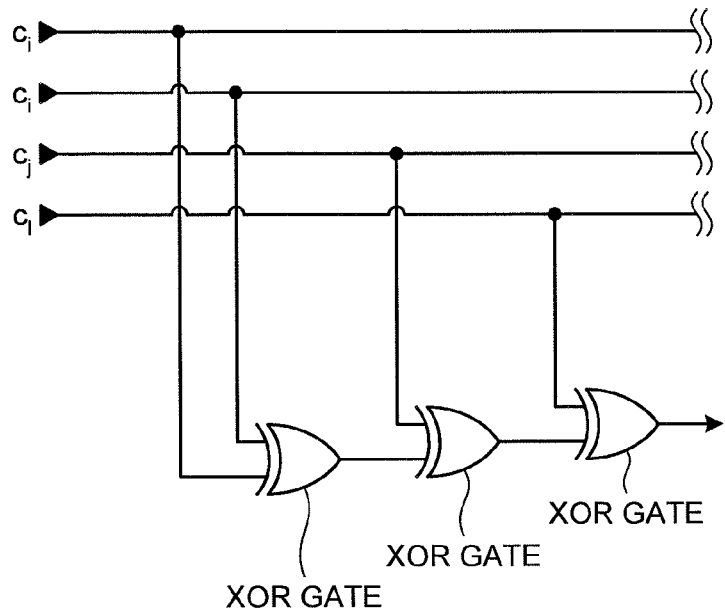
FIG. 11 is a diagram illustrating an exemplary configuration of a likelihood calculating circuit according to a comparative example.

In the example of FIG. 10, since four transistors are used for one unit circuit T and two transistors are used for the final stage inverter 40, the total number of transistors required is 4×4+2=18. In a case of a configuration realizing a likelihood calculating circuit using multistage (multi-input) XOR gates taken as a comparative example with respect to FIG. 10, an XOR gate typically includes 16 transistors, and in this example, three stages of XOR gates are required for one check node, that is, 48 transistors are required (see FIG. 11). In contrast, in the example of FIG. 10, since the total number of transistors required is only 16, the total number of transistors required is smaller and the likelihood calculating circuit can be realized with a much smaller area than the configuration realizing the likelihood calculating circuit by simply using XOR gates.

In such a circuit as illustrated in FIG. 10, since an output from the inverter is input from a source electrode of a monolithic MOSFET, there arises a problem of so-called "threshold reduction". For example, even when Vg is applied to the gate electrode of the NMOS to apply voltage from the input electrode, the voltage across the drain electrode is only increased up to Vg-Vtn (Vtn: threshold voltage of the NMOS). Similarly, when 0 is input to source and gate electrodes of the PMOS, the potential at the drain electrode is only decreased down to Vtp (Vtp: threshold voltage of the PMOS). In practice, when the power supply voltage is 1 V and a pulse of 1 V passes through the NMOS, the pulse height is decreased to 0.6 V, while when a pulse of 0 V passes through the PMOS, the pulse height is increased to about 0.4 V. In the circuit illustrated in FIG. 10, however, it is possible to suppress the "threshold reduction" as described above by recovering the voltage by the inverter 60 immediately before output to a next stage unit circuit T.

Figure 12:
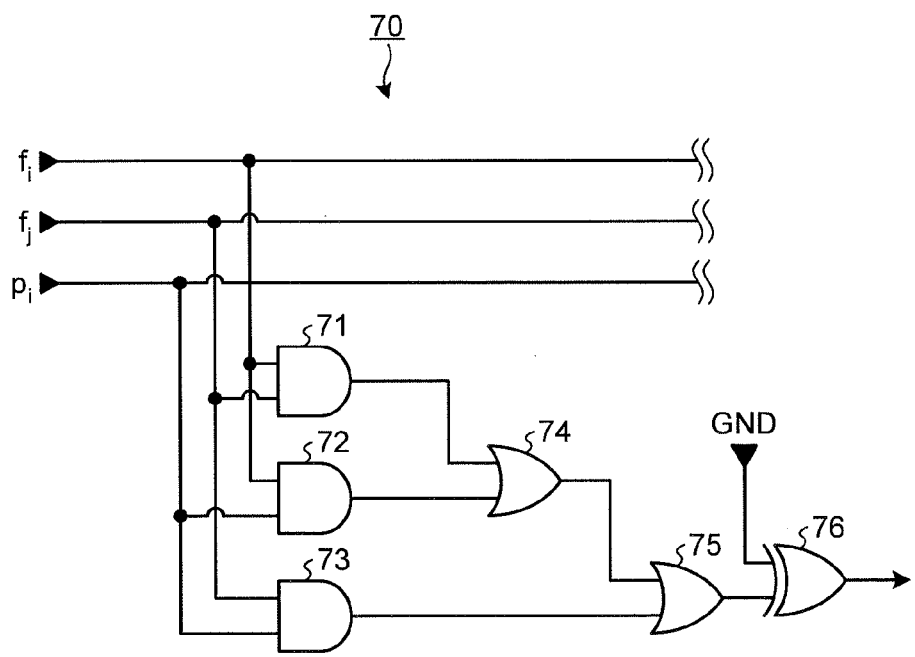
FIG. 12 is a diagram illustrating an exemplary configuration of a majority decision circuit according to the embodiment.

FIG. 12 is a diagram illustrating a detailed exemplary configuration of the majority decision circuit. In FIG. 12, a majority decision circuit 70 associated with the variable node ci connected to check nodes fi and fj is illustrated as an example. For convenience of explanation, the second message from the check node fi is represented by fi ("0" or "1") and the second message from the check node fj is represented by fj ("0" or "1") in the example of FIG. 12. In addition, the probability (first message) of the variable node ci itself is represented by Pi ("0" or "1").

As illustrated in FIG. 12, the majority decision circuit 70 includes three stages of AND circuits 71, 72 and 73, two stages of OR circuits 74 and 75 and one stage of XOR circuit 76. In this example, the second message fi from the check node fi and the second message fj from the check node fj are input to the AND circuit 71. In addition, the second message fi from the check node fi and the probability Pi of the variable node ci itself are input to the AND circuit 72. Furthermore, the second message fj from the check node fj and the probability Pi of the variable node ci itself are input to the AND circuit 73.

Outputs from AND circuit 71 and the AND circuit 72 are input to the OR circuit 74. In addition, an output from the OR circuit 74 and an output from the AND circuit 73 are input to the OR circuit 75. An output from the OR circuit 75 and the low-level input signal GND are then input to the XOR circuit 76, and the result of majority decision is determined according to an input from the XOR circuit 76. More specifically, if the number of "0"s is larger among the inputs fi, fj and Pi, the output from the OR circuit 75 will be low level and the output from the XOR circuit 76 will also be low level ("0"). If the number of "1"s is larger among the inputs fi, fj and Pi, on the other hand, the output from the OR circuit 75 will be high level and the output from the XOR circuit 76 will also be high level ("1"). The circuit configuration illustrated in FIG. 12 is an example of the majority decision circuit, and the majority decision circuit is not limited thereto.

Referring back to FIG. 7, description will be made on the inverting unit 30. The inverting unit 30 inverts the estimated value generated by the estimating unit 12 with a probability higher than 0 and lower than 1. This is because, as described above, it is found that, in order to avoid the closed loop of the calculation for correction produced by the result of likelihood calculation and the state in which errors are not corrected any more in error correction in the hard decision scheme, it is necessary to disturb the loop of parity check calculation, and that, in order to disturb the closed loop of the calculation for correction, it is preferable to invert the estimated value generated by the estimating unit 12 with a probability higher than 0 and lower than 1. As described above, the probability with which inversion of the estimated value by the inverting unit 30 is performed is preferably within a range of $1/6000$ to $1/100$. Furthermore, the probability with which inversion of the estimated value by the inverting unit 30 is performed is more preferably within a range of $1/1000$ to $1/100$.

Figure 13:
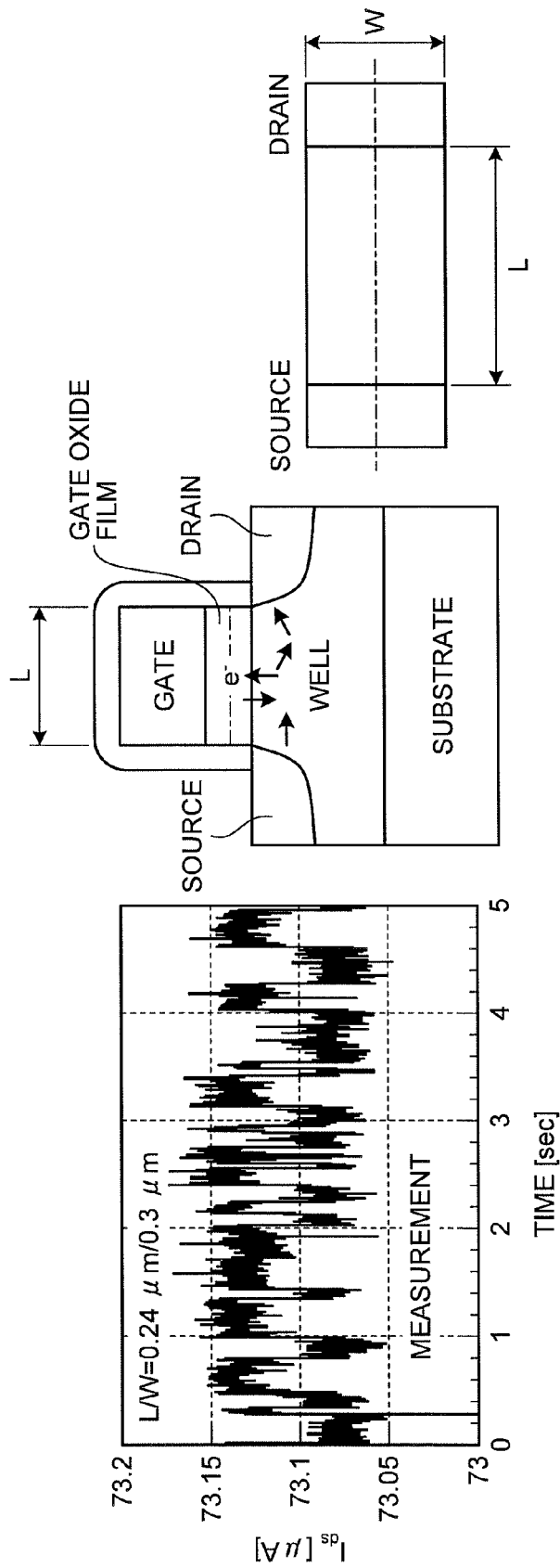
FIG. 13 is a graph illustrating an exemplary state of RTN and a diagram illustrating an exemplary structure of a MOSFET.

As a mechanism for performing bit inversion with a low probability, random telegraph noise (RTN) in a MOSFET can be considered as an example. FIG. 13 includes a graph illustrating fluctuation of a signal (drain current Ids) output from a MOSFET due to RTN and a diagram illustrating an exemplary configuration of a typical MOSFET. RTN refers to a phenomenon that a threshold voltage Vth of I-V characteristics fluctuates with charge trapping and detrapping in an insulating film (a gate oxide film) of a MOSFET. The fluctuation of the threshold voltage Vth can be observed in fluctuation of the drain current Ids. In FIG. 13, L represents the gate length of the MOSFET. In addition, W represents the channel width of the MOSFET. In a generation in which the gate length L is 20 nm, although being also dependent on the effective thickness of the gate oxide film, the fluctuation of the threshold voltage of 100 mV or larger is considered to occur owing to RTN with a probability of about $1/1000$, which is an appropriate noise generation probability. Since the RTN signal is dependent not only on the gate length L but also on the channel width W, it is desired to produce a MOSFET structure with an appropriate size depending on the required size of circuits.

Figure 14:
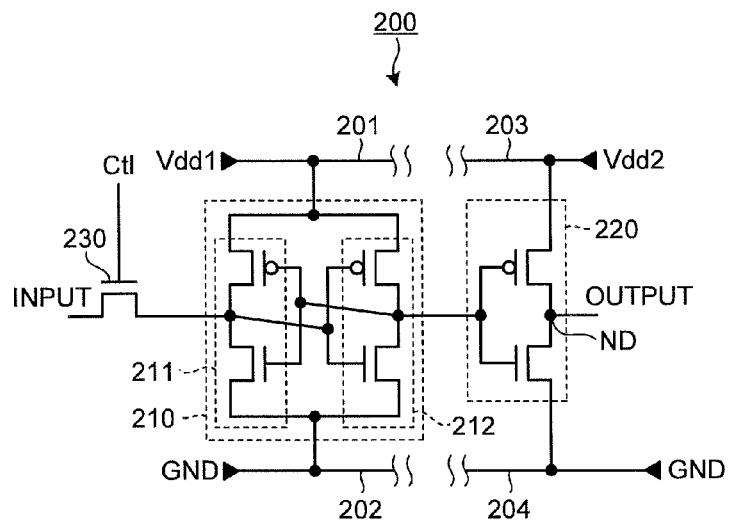
FIG. 14 is a diagram illustrating an exemplary configuration of a bit inverting circuit according to the embodiment.

The inverting unit 30 of the embodiment includes a plurality of bit inverting circuits 200 associated one-to-one with a plurality of variable nodes. The inverting unit 30, however, is not limited thereto and may be in a form in which a variable node without any bit inverting circuit associated therewith is included in a plurality of variable nodes, for example. In other words, the inverting unit 30 may be in any form capable of inverting an estimated value associated with at least one of the variable nodes with a low probability. In the embodiment, the storage cell 15 (see FIG. 9) in which the estimated value of each variable node (an estimated bit estimated by the estimating unit 12) is provided for each variable node, and the bit inverting circuit 200 associated with the variable node is connected to the storage cell 15. FIG. 14 is a diagram illustrating an exemplary configuration of one bit inverting circuit 200. As illustrated in FIG. 14, the bit inverting circuit 200 includes a flip-flop 210 and an inverter 220 that inverts a signal output from the flip-flop 210. Note that what is called a flip-flop herein refers to a self-holding circuit when current is applied and may be regarded as a latch. Specifically, a structure in which inverters are opposed to each other is illustrated.

The flip-flop 210 is arranged between a first power source line 201 to which a power source potential Vdd1 is supplied and a second power source line 202 to which a ground potential GND (<Vdd1) is supplied. The flip-flop 210 includes a first inverter 211 and a second inverter 212, an input to the first inverter 211 is connected with an input to the second inverter 212 and an output from the first inverter 211 is connected with an output from the second inverter 212. Each of the first inverter 211 and the second inverter 212 includes a combination of a PMOS and an NMOS.

A switch element 230 that is switched on/off according to a control signal Ct1 supplied from a control circuit that is not illustrated is provided at the input of the flip-flop 210. While the switch element 230 is constituted by an NMOS in this example, the switch element 230 is not limited thereto. In the example of FIG. 14, the estimated value ("0" or "1") stored in the storage cell 15 is input as an input signal Input to the flip-flop 210 via the switch element 230. The control signal Ct1 is set to high level at a timing when the estimated value ("0" or "1") stored in the storage cell 15 is input to the flip-flop 210.

For example, when the switch element 230 is switched on and a high level ("1") input signal Input is input to the flip-flop 210, the PMOS of the first inverter 211 and the NMOS of the second inverter 212 are turned, and the output signal from the flip-flop 210 becomes low level ("0"). When the switch element 230 is switched on and a low level ("0") input signal Input is input to the flip-flop 210, on the other hand, the NMOS of the first inverter 211 and the PMOS of the second inverter 212 are turned on, and the output signal from the flip-flop 210 becomes high level ("1"). Note that, once the input signal Input is input to the flip-flop 210, the output signal from the flip-flop 210 is maintained at the level of the input signal Input until a next input signal Input is input even if the switch element 230 is switched off thereafter. In other words, storage information is latched.

The output signal from the flip-flop 210 is inverted by the inverter 220. The signal inverted by the inverter 220 is then output as a final output signal Output to the determining unit 13. As illustrated in FIG. 14, the inverter 220 is arranged between a third power source line 203 to which a power source potential Vdd2 is supplied and a fourth power source line 204 to which a ground potential GND (<Vdd2) is supplied. If the value of the potential supplied to the first power source line 201 mentioned above and the value of the potential supplied to the third power source line 203 are equal, the first power source line 201 and the third power source line 203 may be formed integrally. Similarly, if the value of the potential supplied to the second power source line 202 mentioned above and the value of the potential supplied to the fourth power source line 204 are equal, the second power source line 202 and the fourth power source line 204 may be formed integrally. The inverter 220 includes a combination of a PMOS and an NMOS, and the potential of a node ND between the PMOS and the NMOS becomes the final output signal Output.

Figure 15:
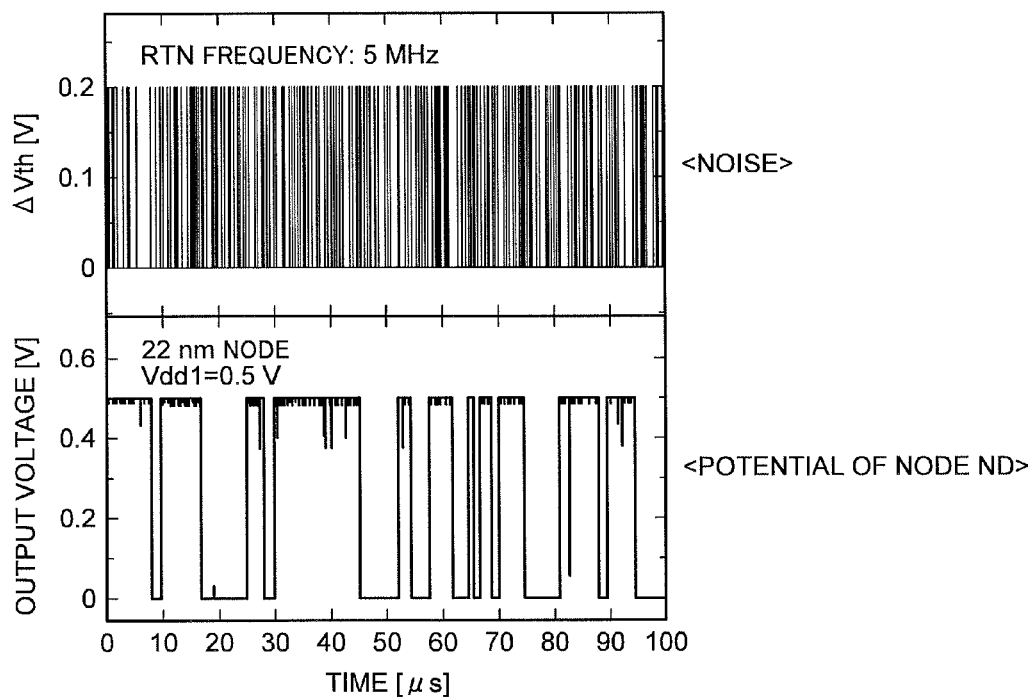
FIG. 15 is a graph illustrating an exemplary state of bit inversion performed by the bit inverting circuit according to the embodiment.

As described above, when RTN occurs in the MOSFET, the drain current Ids (the signal output from the MOSFET) is inverted owing to fluctuation of the threshold voltage Vth. Since the probability of RTN generation in the MOSFET is increased as the SRAM is miniaturized, a bit error may occur. In the embodiment, however, the mechanism of bit inversion caused by the occurrence of RTN is positively utilized. FIG. 15 is a graph illustrating a change in a voltage signal with time due to the noise (RTN) generated in the MOSFET and a change in the potential of the node ND (output signal Output) with time. Noise illustrated in FIG. 15 is obtained by modeling the RTN characteristic of a typical MOSFET and reproducing the RTN characteristic for simulation, and the amplitude and the frequency thereof can be set to arbitrary values so as to be easily handled in circuit simulations. In this example, the amplitude is adjusted to 0.2 V and the frequency is adjusted to 5 MHz. As described above, the fluctuation of the threshold voltage Vth can be observed in fluctuation of the drain current Ids. Noise illustrated in FIG. 15 is obtained by modeling the change of the threshold voltage Vth with time on the basis of measured values of the drain current Ids, and illustrating a voltage waveform effectively applied to the gate voltage.

A result of setting the control signal Ct1 of FIG. 14 to low level (setting the switch element 230 to off) so that the potential of the input signal Input is not applied to the flip-flop 210, and inverting the signal held in the flip-flop 210 by the inverter 220 is the voltage waveform of the node ND, which is illustrated in the lower part of FIG. 15. The reason why the output signal from the flip-flop 210 is made to pass through the inverter 220 instead of outputting the signal as the final output signal Output without any change is to prevent the influence of the noise in the flip-flop 210 from being transmitted as it is to the output signal Output. In other words, the output signal Output may be obtained in any manner as long as the result of inverting the output signal ("0" or "1") held in the flip-flop 210 owing to the influence of Noise is reflected in the potential of the node ND. While this example is one in which VDD1 and VDD2 that are equal to each other are applied, it is also possible to set the value of VDD2 to be higher than that of VDD1 so as to effectively transmit the potential of the node ND to further later stages.

When RTN at a high frequency of about 5 MHz is generated as Noise illustrated in FIG. 15, the signal held in the flip-flop 210 is inverted at a timing when RTN is generated at the same time the MOSFETs of the flip-flop 210, and the inverted result is reflected in the potential of the node ND. Note that, in the example of FIG. 15, 0.5 V is applied as the power source voltage Vdd1 illustrated in FIG. 14. When the value of the power source voltage Vdd1 is sufficiently high, the noise margin of the flip-flop 210 becomes sufficiently larger than the noise amplitude (the amplitude of the fluctuation of the threshold voltage Vth) of RTN, and the probability of bit inversion becomes very low. For example, as a result of performing the circuit simulation described above by applying 1.0 V as the power source voltage Vdd1 and setting the noise amplitude to 0.15 V, no bit inversion occurred at all in the range of 0 to 100 microseconds (μsec) as illustrated in FIG. 15.

In the example of FIG. 15 in which 0.5 V is applied as the power source voltage Vdd1, bit inversion occurs about 20 times in the range of 0 to 100 microsecond (μsec). The probability of generation of bit inversion (inversion probability) by the bit inverting circuits 200 can be obtained from the bit inversion rate. For example, if a circuit configuration having a bit inversion rate as in FIG. 15 is used when an inversion probability of one per a thousand bit inverting circuits 200 (1/1000) is to be obtained, inversion will occur 20 times per one bit inverting circuit 200 in 100 μsec, and twice per a thousand bit inverting circuits 200 in 10 μsec. This can be interpreted as synonymous with two per a thousand bit inverting circuits 200. Accordingly, a bit inversion rate of 2/1000 is obtained, which is twice as large as the target value when the target value is 1/1000. In order to decrease the bit inversion rate, the amplitude and the frequency of RTN may be decreased. Conversely, in order to increase the bit inversion rate, the amplitude and the frequency of RTN may be increased. The amplitude of RTN can be obtained from the gate length L and the channel width W of the MOSFET, and is inversely proportional to the gate area (=L×W). The amplitude of RTN is also inversely proportional to the thickness of the insulating film (gate oxide film). For example, it is experimentally indicated that an amplitude of 0.1 V is fully possible by setting the thickness of the insulating film (in $SiO_2$ equivalent) to about 10 nm and L (=W) to about 20 nm. The frequency is dependent on the type of the insulating film and the magnitude of the gate voltage, and RTN can be sufficiently observed if the time constant (Tc or Te) when carriers are trapped in or released (escaping) from the insulating film is about 1 μsec. Since observation at 0.1 μsec or lower requires some method such as shielding and impedance matching for high-frequency measurement, data are rarely provided in general but the observation is not physically impossible. Design can also be made by utilizing the dependency of the time constant on the gate voltage and the substrate bias voltage.

As a result of using the packaging methods as described above, it is possible to configure the bit inverting circuit 200 with little RTN generating signals changing irregularly (randomly) with time even at a circuit level by utilizing generation of RTN at a level of a device called MOSFET. The bit inverting circuits 200 of the embodiment are associated one-to-one with the variable nodes, and can be added to the respective storage cells 15 in which the estimated values from the estimating unit 12 are stored with a small increase in the circuit areas. If the variable nodes are originally constituted by SRAMs, the circuit areas can be smaller than those in the related art because of the effect of reduction in LW.

Figure 16:
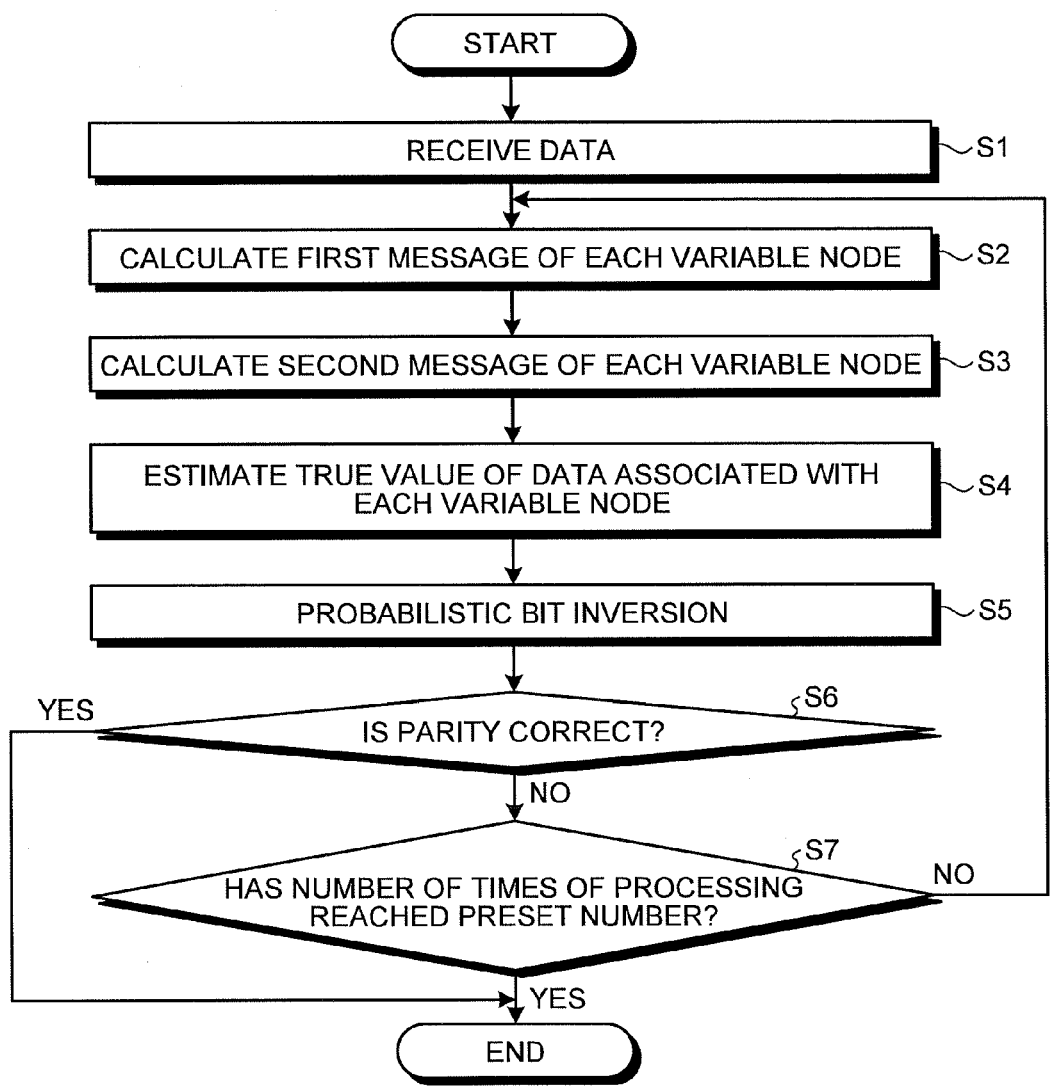
FIG. 16 is a flowchart illustrating an example of processing performed by the error correction device according to the embodiment.

Next, an example of processing performed by the error correction device 100 of the embodiment will be described with reference to FIG. 16. FIG. 16 is a flowchart illustrating an example of processing performed by the error correction device 100 of the embodiment. As illustrated in FIG. 16, the first calculating units 11 first receive a plurality of pieces of data (1-bit data) associated one-to-one therewith (step S1). Next, each first calculating unit 11 calculates a first message of a variable node associated therewith, and transmits the first message to each of a plurality of check nodes connected to the variable node associated therewith (step S2).

Next, each second calculating unit 21 calculates a second message for each of two or more variable nodes connected to a check node associated therewith by using the first messages transmitted from the respective variable nodes connected to the check node associated therewith so that the parity condition is satisfied, and returns the calculated second message to the variable node (step S3). Next, each estimating unit 12 estimates a true value of data associated with each variable node associated therewith by majority decision of the first message calculated by the first calculating unit 11 and the second messages received from the respective check nodes to which the variable node is connected (step S4). Next, the inverting unit 30 inverts a string of the estimated values generated by the estimating units 12 with a probability lower than 1 (step S5), and transmits the inversion result to the determining unit 13.

Next, the determining unit 13 performs parity check on all data at a time by using the data string passed from the inverting unit 30 and a check matrix to determine whether or not parity is correct (step S6). If it is determined that parity is correct (result of step S6: YES), the processing is terminated. If it is determined that parity is violated (result of step S6: NO), the determining unit 13 determines whether or not the number of times of processing (the number of iterations of the algorithm described above) has reached a preset number (step S7). If it is determined that the number of times of processing has not reached the preset number (result of step S7: NO), each first calculating unit 11 calculates the estimated value of the variable node associated therewith output from the inverting unit 30 as the first message of the variable node. Then, processing of step S2 and subsequent steps described above is repeated.

As described above, in the embodiment, it is found that, in order to avoid the closed loop of the calculation for correction produced by the result of likelihood calculation (parity check in check nodes) and the state in which errors are not corrected any more in error correction in the hard decision scheme, it is necessary to disturb the closed loop of the calculation for correction produced by the result of likelihood calculation so as to break the closed loop. Then, in the embodiment, the estimated values generated by the estimating units 12 are inverted with a probability higher than 0 and lower than 1 to break the closed loop of the calculation for correction. As a result, it is possible to improve the error correction ability of error correction in the hard decision scheme. Furthermore, in the embodiment, since it is not necessary to combine the soft decision scheme and the hard decision scheme, an error correction device capable of improving the error correction ability with a simple configuration can be provided.

While an embodiment of the present invention has been described, the embodiment has been presented by way of example only, and is not intended to limit the scope of the invention. Indeed, the novel device and method described herein may be embodied in a variety of other forms; furthermore, various omissions, substitutions and changes in the form of the device and method described herein may be made without departing from the spirit of the invention. Modified examples will be described below. The modified examples may be combined in any way.

(1) Modified Example 1

Figure 17:
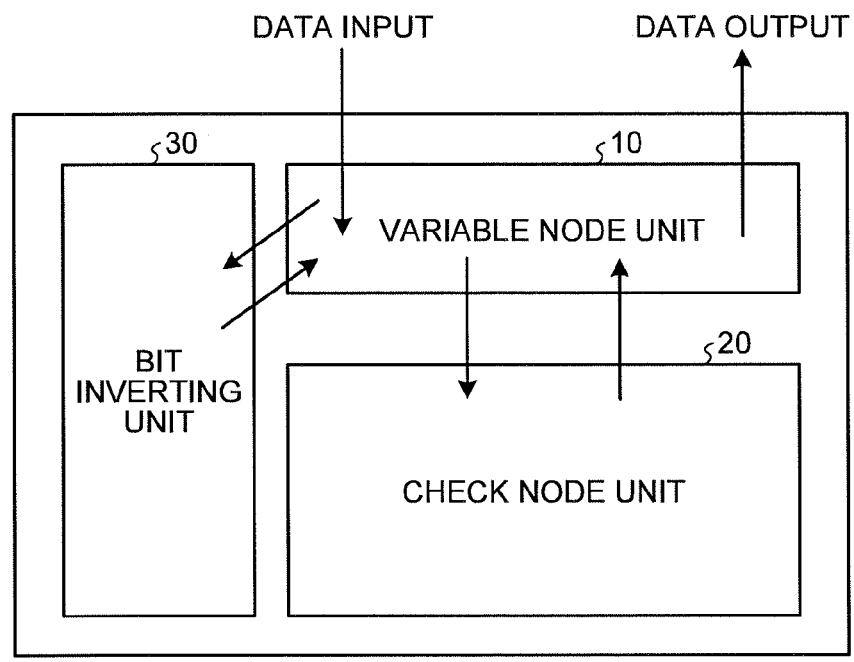
FIG. 17 is a diagram illustrating an exemplary configuration of an error correction device according to the modified example.

For example, in the embodiment described above, the inverting unit 30 is included in the variable node unit 10. Alternatively, the inverting unit 30 may be provided outside of the variable node unit 10 and the check node unit 20 as illustrated in FIG. 17, for example.

(2) Modified Example 2

Figure 18:
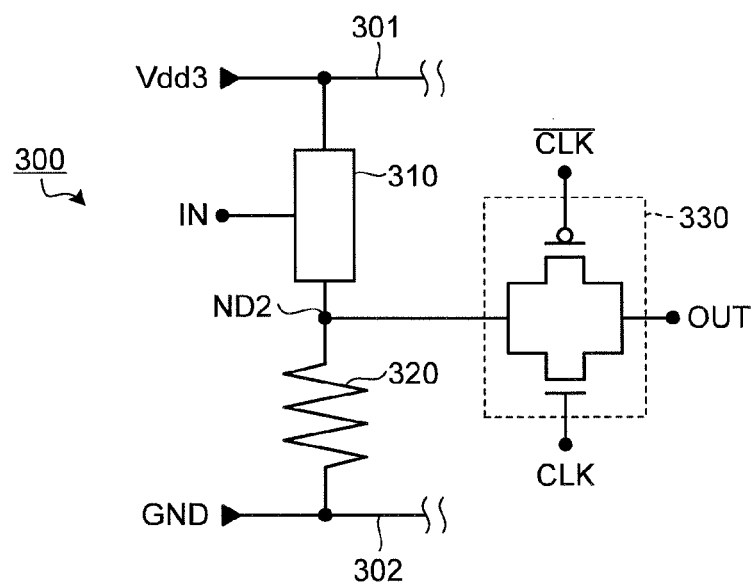
FIG. 18 is a diagram illustrating an exemplary configuration of a bit inverting circuit according to a modified example.

The configuration of the bit inverting circuit described above is not limited to the form illustrated in FIG. 14 but may be in a form as illustrated in FIG. 18, for example. A bit inverting circuit 300 illustrated in FIG. 18 is in a form in which an output signal from a MOSFET resulting from inversion due to RTN is obtained in synchronization with a predetermined clock signal. More specifically, the configuration is as follows. As illustrated in FIG. 18, the bit inverting circuit 300 includes a bit inverting element 310, a resistor 320 and a clock input unit 330. The bit inverting element 310 and the resistor 320 are arranged between a fifth power source line 301 to which a power source potential Vdd3 is supplied and a sixth power source line 302 to which a ground potential GND (<Vdd3) is supplied, and are connected in series with each other. On a current path from the fifth power source line 301 to the sixth power source line 302, a node ND2 is provided between the bit inverting element 310 and the resistor 320, and the node ND2 is connected to an input of the clock input unit 330.

The bit inverting element 310 is constituted by a MOSFET and arranged between the fifth power source line 301 and the node ND2. The estimated value ("0" or "1") of the associated variable node is input to the gate of the bit inverting element 310. When the bit inverting element 310 is constituted by an NMOS, for example, if the estimated value of the associated variable node (the estimated value stored in the storage cell 15) is "0", the bit inverting element 310 is turned off and the output potential of the node ND2 (the output signal from the MOSFET) becomes low level. If the estimated value of the associated variable node is "1", on the other hand, the bit inverting element 310 is turned on and the output potential of the node ND2 becomes high level. As described above, as a result of the fluctuation of the threshold voltage Vth of the MOSFET due to generation of RTN, the output potential of the node ND2 is inverted with a low probability. While the bit inverting element 310 in the example of FIG. 18 is constituted by an NMOS, the bit inverting element 310 is not limited thereto and may be constituted by a PMOS, for example.

The clock input unit 330 is constituted by a combination of an NMOS and a PMOS. A predetermined clock signal CLK is input to the clock input unit 330 to sample the output potential of the node ND2, and the sampling result is output to the determining unit 13. While the clock signal CLK is input to the gate of the NMOS, a signal obtained by inverting the clock signal CLK is input to the gate of the PMOS.

Figure 19:
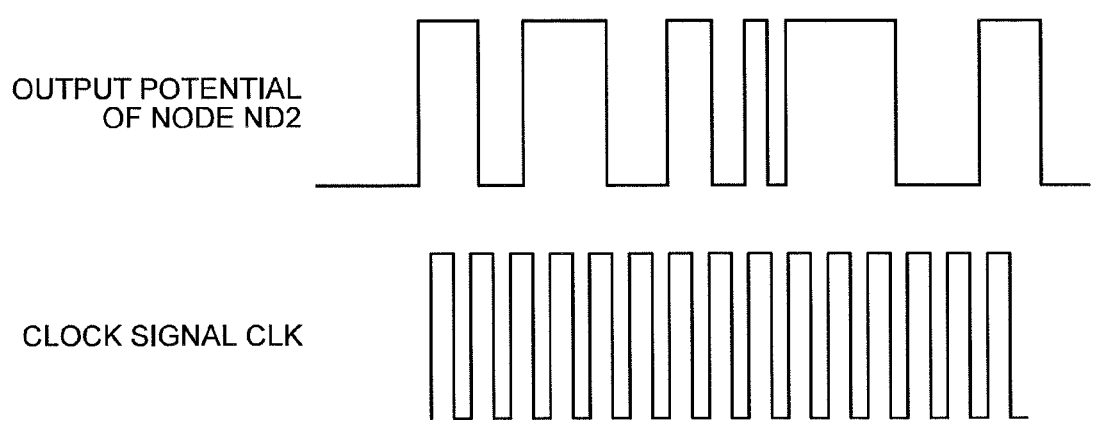
FIG. 19 is a diagram illustrating the relation between the output of the bit inverting circuit and a clock signal according to the modified example.

A case in which the estimated value stored in the storage cell 15 associated with the bit inverting circuit 300 illustrated in FIG. 18 (the estimated value of the variable node associated with the bit inverting circuit 300) is "1" is assumed here. In this case, since a high level ("1") signal is input to the gate of the bit inverting element 310 constituted by an NMOS, the bit inverting element 310 should be turned on and the output potential of the node ND2 should be high level. As a result of generation of RTN, however, the output signal from the bit inverting element 310 is inverted with a low probability. FIG. 19 is a diagram illustrating an example of the relation between the output potential of the node ND2 and the clock signal CLK in this case. Even when the bit inverting circuit 300 as described above is used, the estimated bit input to the gate of the bit inverting element 310 can be inverted with a low probability. In other words, the inverting unit 30 can be in a form including a MOSFET with the threshold voltage fluctuating as a result of generation of random telegraph noise and inverting an estimated value generated by the estimating unit 12 according to the fluctuation of the threshold voltage.

(3) Modified Example 3

Figure 20:
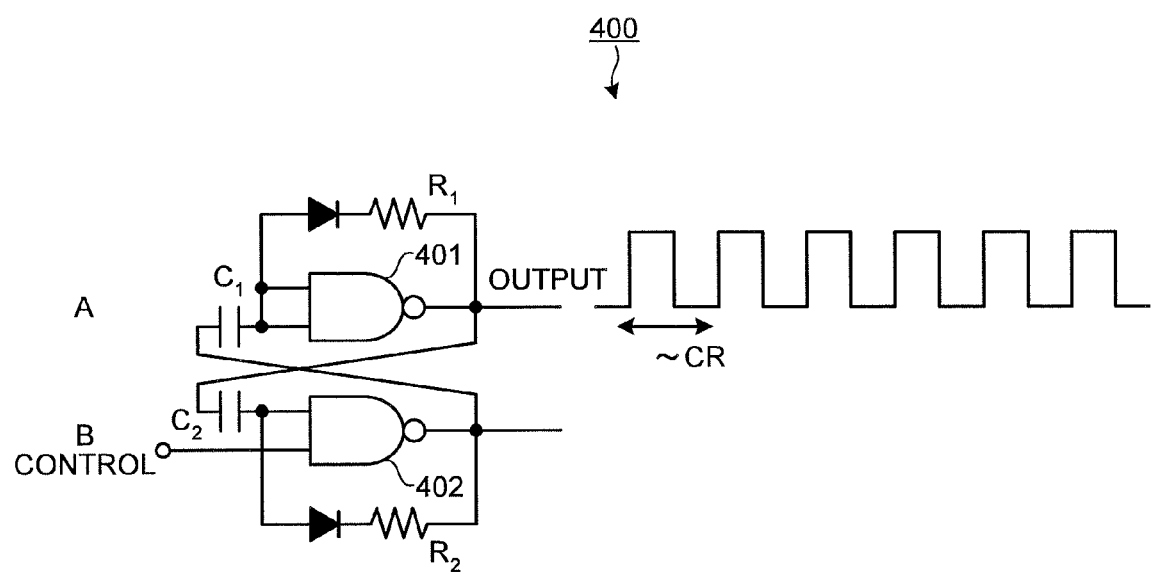
FIG. 20 is a diagram illustrating an exemplary configuration of a bit inverting circuit according to the modified example.

Alternatively, a random number generating circuit 400 as illustrated in FIG. 20, for example, may be used instead of the bit inverting circuit described above. The random number generating circuit 400 illustrated in FIG. 20 includes two NAND circuits 401 and 402 connected in flip-flop configuration, a resistor R1 and a capacitor C1 connected to the NAND circuit 401, and a resistor R2 and a capacitor C2 connected to the NAND circuit 402.

The random number generating circuit 400 starts operating when a control input at B is turned on. If the control input at B input to the NAND circuit 402 is low level ("0") (that is, the charge stored by the capacitor C2 is 0), the output of the NAND circuit 402 becomes high level ("1"), and charging of the capacitor C2 at A is started. As the charging of the capacitor C1 progresses, the input to the NAND circuit 401 via the capacitor C1 becomes low level, the output from the NAND circuit 401 thus becomes high level, and in turn, charging of the capacitor C2 at B is started. As a result of alternately repeating these processes, the output (Output) from the NAND circuit 401 is a signal alternately repeating "1" and "0". The period of this repetition is determined according to charging times of the capacitors C1 and C2 and is proportional to a product (C×R) of the capacitance C of the capacitor and the resistance R. For example, it is also possible to invert the estimated value stored in the storage cell 15 (the estimated value of the associated variable node) with a low probability by replacing the estimated value with a signal ("1" or "0") output from the random number generating circuit 400.

(4) Modified Example 4

Figure 21:
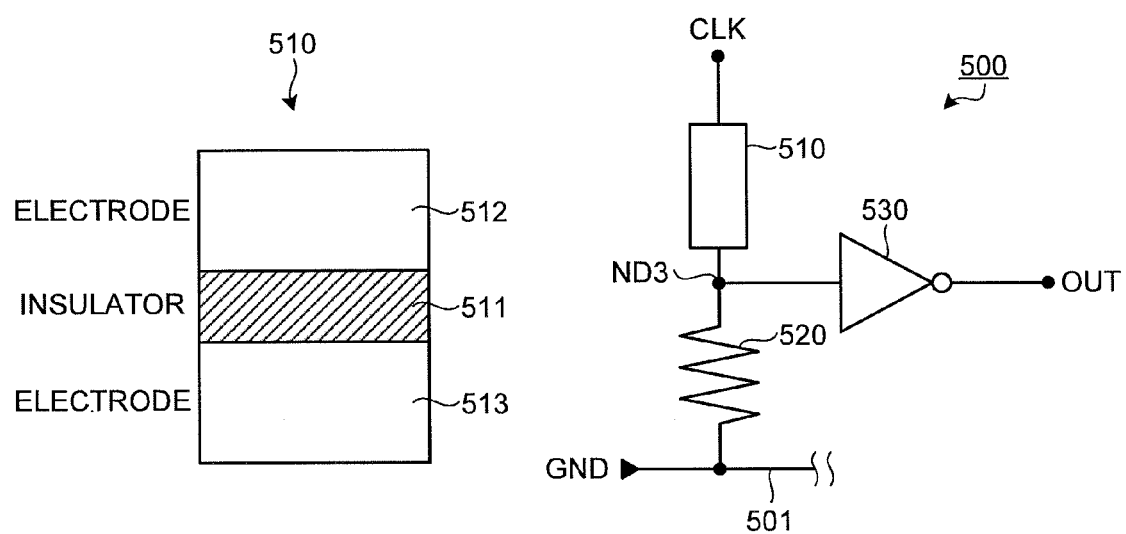
FIG. 21 is a diagram illustrating an exemplary configuration of a bit inverting circuit according to the modified example.

Alternatively, the bit inverting circuit may be constituted by a random number generating circuit 500 as illustrated in FIG. 21, for example. The random number generating circuit 500 illustrated in FIG. 21 includes a bit inverting element 510 to which a clock signal CLK is input, a resistor 520, and an inverter 530. The bit inverting element 510 includes an insulator 511, and a pair of electrodes 512 and 513 holding the insulator 511 therebetween. A clock signal CLK is input to the electrode 512. The electrode 513 is connected to one end of the resistor 520. The other end of the resistor 520 is connected to a grounding conductor 501 to which a ground potential GND is supplied. A node ND3 arranged between the bit inverting element 510 and the resistor 520 is connected to an input of the inverter 530.

In this example, the resistance of the bit inverting element 510 fluctuates as a result of generation of RTN. In other words, the bit inverting element 510 behaves as a variable resistive element whose resistance fluctuates with a low probability, and the output potential of the node ND3 also fluctuate with the fluctuation of the resistance of the bit inverting element 510. As a result, the output signal from the random number generating circuit 500 (the output signal from the inverter 530) is inverted with a low probability. For example, it is also possible to invert the estimated value stored in the storage cell 15 with a low probability by replacing the estimated value with a signal ("1" or "0") output from the random number generating circuit 500. In other words, the inverting unit 30 can be in a form including a random number generating circuit that outputs a binary signal ("0" or "1") at random and inverting an estimated value generated by the estimating unit 12 according to the signal output from the random number generating circuit.

(5) Modified Example 5

While the inverting unit 30 is constituted by a semiconductor integrated circuit in the examples described above, the inverting unit 30 is not limited thereto. Alternatively a computer including a CPU, a ROM, a RAM and the like may be provided in the error correction device, and the functions of the inverting unit 30 described above may be implemented by executing programs stored in the ROM or the like by the CPU. In other words, the inverting unit 30 may be in any form having a function of inverting an estimated value (digital data of "0" or "1") generated by the estimating unit 12 with a probability higher than 0 and lower than 1.

In addition, the programs to be executed by the computer provided in the error correction device 100 described above may be stored on a computer connected to a network such as the Internet, and provided by being downloaded via the network. Alternatively, the programs to be executed by the computer provided in the error correction device 100 described above may be provided or distributed through a network such as the Internet. Still alternatively, the programs to be executed by the error correction device 100 described above may be embedded on a nonvolatile storage medium such as a ROM in advance and provided therefrom.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An error correction device comprising:
a plurality of first calculators each of which is provided for each of a plurality of variable nodes to which a plurality of pieces of 1-bit data coded on the basis of a low density parity check matrix and is configured to calculate a first message representing a probability that a value of the data input to the variable node is 1;
a plurality of second calculators each of which is provided for each of a plurality of check nodes connected to the variable nodes in connecting states according to the low density parity check matrix and is configured to calculate a second message representing a probability that a value of the data input to the variable node is 1 for each of two or more variable nodes connected to the check node by using the first messages of the respective two or more variable nodes connected to the check node;
a plurality of estimators each of which is provided for each of the variable nodes and is configured to estimate a true value of the data input to the variable node to generate an estimated value by using the first messages and the second messages; and an inverter configured to invert the estimated value associated with at least one of the variable nodes with a probability higher than 0 and lower than 1.

2. The device according to claim 1, wherein each of the first calculators calculates a value of a piece of 1-bit data that is to be input to a variable node corresponding to an own first calculator as the first message and transmits a calculated first message to each of two or more check nodes to which the variable node corresponding to the own first calculator is connected.

3. The device according to claim 2, wherein each of the second calculators determines, for every two or more variable nodes connected to a check node corresponding to an own second calculator, a value of a piece of 1-bit data that is to be input to the variable node on the basis of the first message of another variable node differing from the variable node among the two or more variable nodes connected to the check node corresponding to the own second calculator and on the basis of a parity condition, and the second calculator calculates a determined value of the piece of 1-bit data as the second message of the variable node and returns a calculated second message to the variable node.

4. The device according to claim 1, wherein the probability that the inversion of the estimated value is performed by the inverter is within a range of $1/6000$ to $1/100$.

5. The device according to claim 1, wherein the probability that the inversion of the estimated value is performed by the inverter is within a range of $1/1000$ to $1/100$.

6. The device according to claim 1, wherein the inverter includes a MOSFET whose threshold voltage fluctuates as a result of generation of random telegraph noise and inverts the estimated value according to the fluctuation of the threshold voltage.

7. The device according to claim 1, wherein the inverter includes a random number generating circuit configured to output a binary signal at random and invert the estimated value according to the signal output from the random number generating circuit.

8. The device according to claim 1, further comprising a determining unit that determines whether or not the estimated value output from the inverter satisfies a parity condition.

9. An error correction method comprising:

first calculating, for each of a plurality of variable nodes to which a plurality of pieces of 1-bit data coded on the basis of a low density parity check matrix, a first message representing a probability that a value of the data input to the variable node is 1;

second calculating, for each of two or more variable nodes connected to each of a plurality of check nodes connected to the variable nodes in connecting states according to the low density parity check matrix, a second message representing a probability that a value of the data input to the variable node is 1 by using the first messages of the two or more variable nodes connected to the check node;

estimating, for each of the variable nodes, a true value of the data input to the variable node by using the first messages and the second messages to generate an estimated value; and inverting the estimated value associated with at least one of the variable nodes with a probability higher than 0 and lower than 1.

10. The method according to claim 9, wherein the first calculating includes calculating a value of a piece of 1-bit data that is to be input to a variable node corresponding to an own first calculator as the first message and transmitting a calculated first message to each of two or more check nodes to which the variable node corresponding to the own first calculator is connected.

11. The method according to claim 10, wherein the second calculating includes determining, for every two or more variable nodes connected to a check node corresponding to an own second calculator, a value of a piece of 1-bit data that is to be input to the variable node on the basis of the first message of another variable node differing from the variable node among the two or more variable nodes connected to the check node corresponding to the own second calculator and on the basis of a parity condition, and the second calculating includes calculating a determined value of the piece of 1-bit data as the second message of the variable node and returning a calculated second message to the variable node.

12. The method according to claim 9, wherein the probability that the inversion of the estimated value is performed by the inverting is within a range of $1/6000$ to $1/100$.

13. The method according to claim 9, wherein the probability that the inversion of the estimated value is performed by the inverting is within a range of $1/1000$ to $1/100$.

14. The method according to claim 9, further comprising determining whether or not the estimated value output by the inverting satisfies a parity condition.

15. A computer program product comprising a non-transitory computer-readable medium including programmed instructions, wherein the instructions, when executed by a computer, cause the computer to perform:

first calculating, for each of a plurality of variable nodes to which a plurality of pieces of 1-bit data coded on the basis of a low density parity check matrix, a first message representing a probability that a value of the data input to the variable node is 1;

second calculating, for each of two or more variable nodes connected to each of a plurality of check nodes connected to the variable nodes in connecting states according to the low density parity check matrix, a second message representing a probability that a value of the data input to the variable node is 1 by using the first messages of the two or more variable nodes connected to the check node;

estimating, for each of the variable nodes, a true value of the data input to the variable node by using the first messages and the second messages to generate an estimated value; and inverting the estimated value associated with at least one of the variable nodes with a probability higher than 0 and lower than 1.

16. The computer program product according to claim 15, wherein the first calculating includes calculating a value of a piece of 1-bit data that is to be input to a variable node corresponding to an own first calculator as the first message and transmitting a calculated first message to each of two or more check nodes to which the variable node corresponding to the own first calculator is connected.

17. The computer program product according to claim 16, wherein the second calculating includes determining, for every two or more variable nodes connected to a check node corresponding to an own second calculator, a value of a piece of 1-bit data that is to be input to the variable node on the basis of the first message of another variable node differing from the variable node among the two or more variable nodes connected to the check node corresponding to the own second calculator and on the basis of a parity condition, and the second calculating includes calculating a determined value of the piece of 1-bit data as the second message of the variable node and returning a calculated second message to the variable node.

18. The computer program product according to claim 15, wherein the probability that the inversion of the estimated value is performed by the inverting is within a range of $1/6000$ to $1/100$.

19. The computer program product according to claim 15, wherein the probability that the inversion of the estimated value is performed by the inverting is within a range of $1/1000$ to $1/100$.

20. The computer program product according to claim 15, wherein the instructions further cause the computer to perform determining whether or not the estimated value output by the inverting satisfies a parity condition.

* * * * *